United States Patent
Cao et al.

(10) Patent No.: US 8,736,004 B2
(45) Date of Patent: May 27, 2014

(54) MAGNETIC TUNNEL JUNCTION FOR MRAM APPLICATIONS

(71) Applicant: MagIC Technologies, Inc., Milpitas, CA (US)

(72) Inventors: Wei Cao, San Jose, CA (US); Witold Kula, Sunnyvale, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/941,741

(22) Filed: Jul. 15, 2013

(65) Prior Publication Data

US 2013/0299823 A1  Nov. 14, 2013

Related U.S. Application Data

(62) Division of application No. 13/136,929, filed on Aug. 15, 2011, now Pat. No. 8,492,169.

(51) Int. Cl.
*H01L 29/82* (2006.01)
*H01L 43/08* (2006.01)
*G11C 11/14* (2006.01)
*G11C 11/22* (2006.01)
*G11C 11/34* (2006.01)

(52) U.S. Cl.
USPC .... 257/421; 257/295; 257/427; 257/E43.005; 365/171; 365/173

(58) Field of Classification Search
None
See application file for complete search history.

(56) References Cited

U.S. PATENT DOCUMENTS

| 7,479,394 | B2 | 1/2009 | Horng et al. |
| 7,595,520 | B2 | 9/2009 | Horng et al. |
| 7,663,131 | B2 | 2/2010 | Horng et al. |
| 7,808,027 | B2 | 10/2010 | Horng et al. |
| 2007/0111332 | A1* | 5/2007 | Zhao et al. ........ 438/3 |
| 2008/0217710 | A1* | 9/2008 | Horng et al. ........ 257/421 |
| 2010/0261295 | A1 | 10/2010 | Horng et al. |
| 2011/0086439 | A1 | 4/2011 | Choi |
| 2012/0181537 | A1 | 7/2012 | Cao et al. |
| 2012/0280337 | A1 | 11/2012 | Cao et al. |

* cited by examiner

*Primary Examiner* — Zandra Smith
*Assistant Examiner* — Pamela E Perkins
(74) *Attorney, Agent, or Firm* — Saile Ackerman LLC; Stephen B. Ackerman (57) ABSTRACT

Reading margin is improved in a MTJ designed for MRAM applications by employing a pinned layer with an AP2/Ru/AP1 configuration wherein the AP1 layer is a CoFeB/CoFe composite and by forming a MgO tunnel barrier adjacent to the CoFe AP1 layer by a sequence that involves depositing and oxidizing a first Mg layer with a radical oxidation (ROX) process, depositing and oxidizing a second Mg layer with a ROX method, and depositing a third Mg layer on the oxidized second Mg layer. The third Mg layer becomes oxidized during a subsequent anneal. MTJ performance may be further improved by selecting a composite free layer having a Fe/NiFeHf or CoFe/Fe/NiFeHf configuration where the NiFeHf layer adjoins a capping layer in a bottom spin valve configuration. As a result, read margin is optimized simultaneously with improved MR ratio, a reduction in bit line switching current, and a lower number of shorted bits.

16 Claims, 3 Drawing Sheets

| Wafer #1 Row/Col | 11 | 10 | 9 | 8 | 7 | 6 | 5 | 4 | 3 | 2 |
|---|---|---|---|---|---|---|---|---|---|---|
| 12 | | | | | 4.60% | 4.70% | 4.87% | | | |
| 11 | | 4.77% | | | 4.92% | 4.77% | 4.76% | 4.84% | 4.72% | |
| 10 | | 4.94% | | 4.83% | 4.63% | 4.96% | 4.68% | 4.48% | 4.70% | |
| 9 | | | 4.58% | 4.86% | 4.78% | 4.79% | 4.91% | 4.83% | 4.64% | |
| 8 | 4.58% | | 4.82% | 4.74% | 4.84% | 4.74% | 4.77% | 5.10% | 4.67% | 4.45% |
| 7 | 4.75% | 4.57% | 4.80% | 4.80% | 4.91% | 4.85% | 4.79% | 4.62% | 4.76% | 4.95% |
| 6 | 5.20% | 5.01% | 5.12% | 5.27% | | 5.04% | 4.86% | 5.30% | 5.17% | 5.11% |
| 5 | 5.22% | | 5.12% | | 4.97% | 5.11% | 5.27% | 5.11% | 5.03% | 4.87% |
| 4 | | | 5.20% | 5.23% | 4.79% | 4.98% | 4.99% | 4.97% | 5.00% | 5.10% |
| 3 | | | | 5.61% | 5.03% | 4.73% | 4.94% | 5.00% | 5.26% | |
| 2 | | | | 5.11% | | 4.98% | 5.20% | 4.81% | | |
| 1 | | | | | 4.95% | | | | | |

FIG. 4a

| Wafer #2 Row/Col | 11 | 10 | 9 | 8 | 7 | 6 | 5 | 4 | 3 | 2 |
|---|---|---|---|---|---|---|---|---|---|---|
| 12 | | | | 4.44% | 4.38% | 4.51% | 4.66% | | | |
| 11 | | 4.27% | | 4.52% | 4.53% | 4.28% | 4.24% | 4.36% | 4.13% | |
| 10 | | 4.49% | 0.00% | 4.41% | 4.54% | 4.51% | 4.38% | 4.26% | 4.52% | |
| 9 | | | 4.32% | 4.41% | 4.46% | 4.56% | 4.57% | 4.29% | 4.37% | |
| 8 | 4.46% | | 4.54% | 4.42% | 4.37% | 4.35% | 4.45% | 4.64% | 4.41% | |
| 7 | 4.31% | 4.33% | 4.43% | 4.34% | 4.48% | 4.19% | 4.45% | 4.47% | 4.45% | |
| 6 | | 4.43% | 4.52% | 4.42% | | 4.61% | 4.19% | 4.53% | 4.27% | |
| 5 | 4.59% | | 4.37% | 4.50% | 4.08% | 4.43% | 4.53% | 4.41% | 4.31% | |
| 4 | | | | 4.16% | 4.22% | 4.38% | 4.38% | 4.31% | 4.27% | 4.37% |
| 3 | | | 4.47% | 4.44% | 4.21% | 4.15% | 4.25% | 4.25% | 4.26% | |
| 2 | | | | | 4.50% | 4.25% | 4.23% | | | |
| 1 | | | | | | | | | | |

FIG. 4b

| Wafer #3 Row/Col | 11 | 10 | 9 | 8 | 7 | 6 | 5 | 4 | 3 | 2 |
|---|---|---|---|---|---|---|---|---|---|---|
| 12 | | | | | 3.15% | 3.39% | 3.56% | | | |
| 11 | | | 3.34% | 3.44% | 3.31% | 3.52% | 3.42% | 3.53% | 3.40% | |
| 10 | | 3.32% | 3.35% | 3.49% | 3.41% | 3.51% | 3.47% | 3.48% | 3.39% | |
| 9 | | 3.26% | 3.35% | 3.26% | 3.34% | 3.59% | 3.40% | 3.64% | 3.40% | |
| 8 | 3.38% | 3.33% | 3.45% | 3.32% | 3.32% | 3.52% | 3.48% | 3.21% | 3.49% | 3.63% |
| 7 | 3.30% | 3.30% | 3.38% | 3.72% | 3.28% | 3.42% | 3.43% | 3.42% | 3.22% | 3.40% |
| 6 | 3.36% | 3.53% | 3.52% | 3.41% | 3.63% | 3.54% | 3.46% | 3.67% | | 3.35% |
| 5 | 3.50% | 3.48% | 3.44% | 3.54% | 3.65% | 3.68% | 3.53% | 3.54% | 3.38% | 3.47% |
| 4 | | | 3.44% | 3.39% | 3.32% | 3.54% | 3.56% | 3.59% | 3.59% | 3.53% |
| 3 | | | | 3.71% | 3.67% | 3.59% | 3.46% | 3.48% | | |
| 2 | | | | | | | | | 3.42% | |
| 1 | | | | | | | | | | |

FIG. 4c

MAGNETIC TUNNEL JUNCTION FOR MRAM APPLICATIONS

This is a Divisional application of U.S. patent application Ser. No. 13/136,929, filed on Aug. 15, 2011, which is herein incorporated by reference in its entirety, and assigned to a common assignee.

RELATED PATENT APPLICATIONS

This application is related to the following: Ser. No. 12/930,877; filing date Jan. 19, 2011; and Ser. No. 13/068,222, filing date May 5, 2011; all assigned to a common assignee and herein incorporated by reference in their entirety.

TECHNICAL FIELD

The present disclosure relates to a high performance Magnetic Tunneling Junction (MTJ) element and, in particular, to a pinned layer/tunnel barrier/free layer stack that lowers bit to bit resistance variation (Rp_cov) thereby improving reading margin without compromising other MTJ properties such as writing margin, MR ratio, and number of shorted bits.

BACKGROUND

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ (memory) element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations. A high speed version of MRAM architecture consists of a cell with an access transistor and a MTJ (1T1MTJ) in the array.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. In a MRAM MTJ, the free layer has traditionally been made of NiFe because of its reproducible and reliable switching characteristics as demonstrated by a low switching field (Hc) and low switching field uniformity (σHc).

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

A high performance MRAM MTJ element is characterized by a high tunneling magnetoresistive (TMR) ratio also referred to as MR ratio where MR is the resistance change as a result of switching from a low resistance state (Rp) to a high resistance state (Rap) and expressed as the ratio (Rap−Rp)/Rp. Other MTJ parameters that are important for MRAM performance are low bit-to-bit resistance variation, low number of shorted bits, and low bit-to-bit switching current (or field) variation. Simultaneous optimization of all the aforementioned parameters is necessary for making high performance MRAM products that should have high reading margin, high writing margin, and lower error counts. Higher MR ratio and lower bit-to-bit resistance variation are necessary for high reading margin. Writing margin is more complicated and depends on many factors including magnetic free layer (coercivity and anisotropy energy), MTJ shape and size, and distance between the overlying word line/bit line and the free layer in the MTJ.

Numerous MTJ designs have been proposed and fabricated in the prior art but there is still a need for improvement in all of the performance categories mentioned above. Typically, an improvement in one property leads to a degradation in one or more other parameters. For example, NiFe affords excellent switching properties but the TMR ratio with a MTJ having a NiFe free layer is lower than can be achieved with CoFe, CoFeB, or other free layer materials. In addition, recent developments show that a MgO/CoFeB tunnel barrier/free layer configuration exhibits very high MR ratio (>200%) but this structure could not be directly applied in MRAM because a MTJ with a CoFeB free layer shows very poor writing margin (wide bit-to-bit switching current) due to its high anisotropy energy. Moreover, a high switch current is needed because of high coercivity associated with a CoFeB free layer. Even a CoFeB/NiFe composite free layer no longer exhibits a high MR characteristic of MgO/CoFeB configurations because the NiFe layer with fcc (111) crystal structure prevents the adjacent CoFeB layer from crystallizing in the bcc (001) phase necessary for high spin polarization (and thus high MR ratio) at the MgO/CoFeB interface.

U.S. Pat. No. 7,808,027 discloses a composite free layer with a NiFeCo/NiFe/NiFeHf configuration that is designed to provide a MR ratio of about 50%, high read margin, and low magnetostriction (λs).

U.S. Patent Application Publication 2010/0261295 teaches a free layer composite represented by Fe/amorphous CoFeB/Fe to achieve a low Gilbert damping constant, low critical current, high MR ratio, and low bit-to-bit resistance variation for a STT-MRAM application.

In U.S. Pat. No. 7,663,131, a MTJ is disclosed that has a CoFeB/CoFe AP1 layer and a NiFe/NiFeHf free layer to minimize error count (EC) while achieving high MR ratio, low magnetostriction, and a RA value of about 1100 ohm-um² for 1 Mbit MRAM devices.

U.S. Pat. No. 7,479,394 describes a MgO tunnel barrier formation process where a first Mg layer is subjected to a radical oxidation step. Then a second Mg layer is deposited and a natural oxidation process is performed.

U.S. Patent Application Publication 2011/0086439 teaches a MgO fabrication sequence wherein a Mg layer is first treated with plasma etching to thin the metal layer and is then subjected to a radical oxidation step. Finally, a Mg cap is deposited on the oxidized first Mg layer.

In spite of all recent advancements in optimizing a MTJ for MRAM, an improved MTJ is still required that improves read margin and write margin without compromising other important MTJ parameters including bit line shorting and switching properties and a high TMR ratio.

SUMMARY

One objective of the present disclosure is to provide a pinned layer/tunnel barrier/free layer stack for a MTJ element that improves reading margin and improves MR ratio but does not degrade writing margin, or increase the number of shorts, or increase the number of unswitched bits at a given bit line current compared with the prior art.

A second objective of the present disclosure is to achieve the improved performance of the first objective without introducing new materials or processes that would increase the cost of fabricating a MTJ element.

These objectives are achieved in a first embodiment that features a MTJ element comprised of a pinned layer/tunnel barrier layer/free layer configuration wherein the pinned layer has a synthetic anti-ferromagnetic (SAF) structure having an AP2/coupling layer/AP1 configuration. The AP2 ferromagnetic layer interfaces with an anti-ferromagnetic (AFM) layer that pins the AP2 layer in a certain direction. The AP1 ferromagnetic layer is anti-ferromagnetically coupled to the AP2 layer and is preferably a composite represented by CoFeB/CoFe where the CoFeB layer adjoins the coupling layer and the CoFe layer contacts the tunnel barrier layer which is preferably MgO. In one aspect, the CoFe layer has a Fe content between 0 and 30 atomic %, is between 4 to 8 Angstroms thick, and is thinner than the CoFeB portion of the AP1 layer. The free layer is formed on the opposite side of the tunnel barrier with respect to the AP1 layer/tunnel barrier interface.

In a bottom spin valve embodiment, the MTJ has a structure wherein a seed layer, the AFM layer, pinned layer, tunnel barrier, free layer, and a capping layer are successively formed on a substrate that is a bottom electrode, for example. Another key feature is the method of fabricating the tunnel barrier which is preferably MgO. According to one embodiment, a first Mg layer having a thickness t1 is deposited on the AP1 layer and is partially oxidized by a radical oxidation (ROX) method. Then a second Mg layer with thickness t2 less than t1 is deposited on the oxidized first Mg layer followed by a second ROX process which fully oxidizes the second Mg layer. Finally, a third Mg layer with thickness of between 2 to 4 Angstroms is deposited on the oxidized second Mg layer. Optionally, the third Mg layer may be subjected to a third ROX process before a fourth Mg layer is laid down. The uppermost Mg layer is not oxidized prior to depositing the free layer and capping layer but becomes oxidized during a subsequent anneal step wherein oxygen from the underlying MgO layer migrates into the top Mg layer and at least partially oxidizes the uppermost Mg layer.

A composite free layer adjoins a surface of the tunnel barrier layer and preferably has a Fe/NiFeX or CoFe/Fe/NiFeX configuration where X is one of Hf, Zr, Nb, Ta, or Mg with a content of about 5 to 30 atomic %. For example, a CoFe/Fe/NiFeHf composite free layer is especially suited to realize the objectives and advantages of the present invention. Preferably, the CoFe free layer has an Fe content of 60 to 90 atomic %, and the NiFeHf layer should be in the range of 20 to 40 Angstroms thick to provide the full advantage of a reduced number of shorted bits and a substantially lower bit switching current. A capping layer such as Ru or Ru/Ta/Ru is the uppermost layer in the MTJ stack and contacts the NiFeHf layer or NiFeX layer.

In a second embodiment, the MTJ may have a top spin valve configuration represented by seed layer/free layer/tunnel barrier/pinned layer/AFM layer/cap layer where the seed layer contacts a substrate and the cap layer is the uppermost layer in the MTJ stack. The NiFeX portion of the free layer contacts the seed layer and the AP1 portion of the pinned layer adjoins the tunnel barrier which is preferably a MgO layer fabricated by a plurality of ROX steps as in the first embodiment.

Alternatively, in both embodiments described above, Fe in the composite free layer may be replaced by FeB where the boron content is less than about 5 atomic %.

DETAILED DESCRIPTION

The present disclosure relates to magnetic tunnel junctions (MTJs) in MRAM devices including spin-transfer torque MRAM or STT-RAM. Although top and bottom spin valve structures are shown in the exemplary embodiments, the present disclosure also encompasses a dual spin valve configuration as appreciated by those skilled in the art. A top surface of a layer is defined as a surface formed in a plane that is parallel to the substrate and facing away from the substrate.

The drawings are provided by way of example and are not intended to limit the scope of the disclosure.

It should be understood that the MRAM structure of the present disclosure is part of a MRAM array having a plurality of MTJ elements arranged in rows and columns on a substrate. Only one MTJ is depicted in the exemplary embodiments in order to simplify the drawings and direct attention to the key feature of the present disclosure which is a pinned layer/tunnel barrier/free layer configuration in a MTJ stack of layers.

Figure 1:
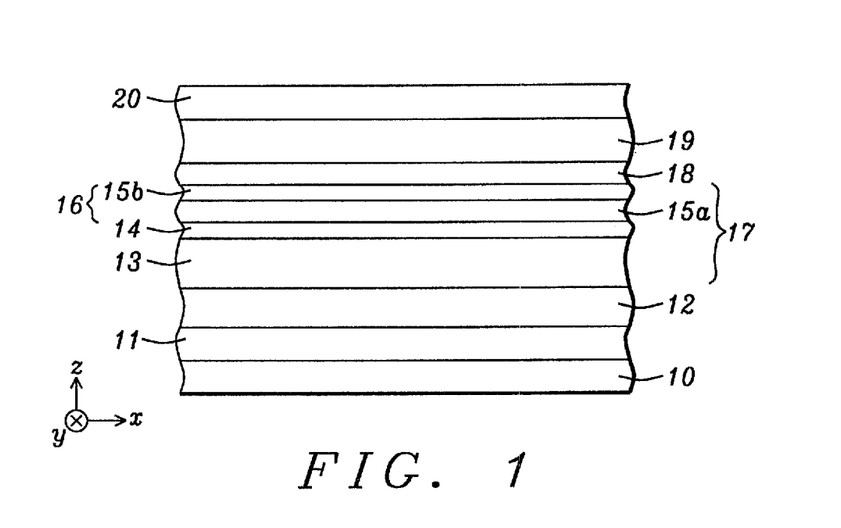
FIG. 1 is a cross-sectional view of a MTJ structure having a bottom spin valve configuration formed according to a first embodiment of the present disclosure.

Referring to FIG. 1, a MTJ structure is illustrated according to a first embodiment of the present disclosure. The substrate 10 may be a bottom conductor layer, for example, also known as a bottom electrode and having a thickness in the z-axis direction and with a top surface in the x,y plane. A MTJ stack of layers is now formed on the substrate 10. It should be understood that all layers in the MTJ stack may be formed in the same process tool such as an Anelva C-7100 thin film sputtering system or the like which typically includes three physical vapor deposition (PVD) chambers, an oxidation chamber, and a sputter etching chamber. At least one of the PVD chambers is capable of co-sputtering using two or more targets. Typically, the sputter deposition process involves an argon sputter gas and the targets are made of metal or alloys to be deposited on a substrate. All MTJ layers may be formed after a single pump down of the sputter system to enhance throughput.

In the exemplary embodiment depicting a bottom spin valve structure, the MTJ stack of layers is fabricated on the substrate 10 by sequentially forming a seed layer 11, AFM layer 12, SAF pinned layer 17, tunnel barrier layer 18, composite free layer 19, and a capping layer 20. The seed layer 11 may be a layer of NiCr, NiFe, or NiFeCr, for example. In an embodiment wherein the seed layer is grown on a bottom conductor with an amorphous Ta capping layer, the result is a smooth and dense (111) seed layer structure that promotes smooth and densely packed growth in subsequently formed MTJ layers.

The AFM layer 12 is preferably made of PtMn although IrMn, NiMn, OsMn, RuMn, RhMn, PdMn, RuRhMn, or MnPtPd are also acceptable. The SAF pinned layer 17 has an AP2/Ru/AP1 configuration wherein the AP2 layer 13 is formed on the AFM layer 12 and is preferably comprised of CoFe although other ferromagnetic layers are acceptable. The magnetic moment of the AP2 layer is pinned in a direction anti-parallel to the magnetic moment of the AP1 layer 16. A slight difference in thickness between the AP2 and AP1 layers produces a small net magnetic moment for the SAF pinned layer 17 in an in-plane direction. Exchange coupling between the AP2 layer and the AP1 layer is facilitated by a coupling layer 14 that is preferably comprised of Ru with a thickness of about 7.5 Angstroms although Rh or Ir may be used instead of Ru.

An important feature is that the AP1 layer 16 on the coupling layer preferably has a CoFeB/CoFe configuration wherein the lower CoFeB layer 15a contacts the coupling layer and has a thickness greater than that of the upper CoFe layer 15b which is from 4 to 8 Angstroms thick. Fe content in the CoFe layer is preferably between 0 and 30 atomic %. CoFe thickness is at least 4 Angstroms in order to observe a benefit in MTJ properties but is not greater than 8 Angstroms so that MR ratio is not degraded. It should be understood that the CoFe layer 15b is deposited with a (001) bcc crystal structure that provides optimal tunneling behavior with an adjoining MgO tunnel barrier 18 having a (001) structure thereby resulting in a high MR ratio. It is believed that an AP1 CoFe layer thickness greater than 8 Angstroms may lead to a different crystal orientation thereby reducing the MR ratio.

Above the SAF pinned layer 17 is formed a thin tunnel barrier layer 18 which in the preferred embodiment is made of MgO although AlOx, TiOx, or other tunnel barrier materials used in the art are also acceptable. One possible route to MgO formation that is typically employed in head manufacturing is to deposit a first Mg layer on the pinned layer followed by a natural oxidation. A second Mg layer is deposited on the oxidized first Mg layer to result in a uniform MgO layer after annealing. This sequence achieves a low RA value of about 10 ohm-um$^2$ or less to satisfy read head design requirements. However, in MRAM fabrication, a substantially higher RA value of up to 1000 ohm-um$^2$ or more is desired and this result is typically achieved by a sequence that begins with deposition of a first Mg layer followed by radical oxidation (ROX) to fully oxidize the first Mg layer. Then a second Mg layer is deposited on the oxidized first Mg layer followed by deposition of a free layer and capping layer prior to annealing the MTJ stack to generate a uniform MgO layer.

Figure 3A:
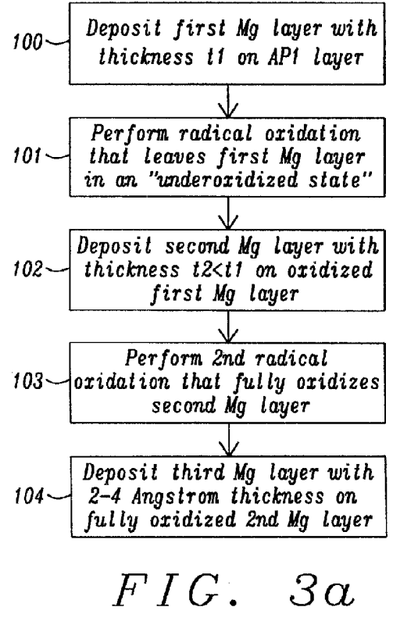
FIG. 3a is a flow chart diagram showing a multi-step MgO tunnel barrier formation sequence according to an embodiment of the present disclosure.

We have discovered a multi-step MgO fabrication method wherein at least two ROX steps are employed as represented in FIG. 3a. The disclosed method surprisingly affords lower Rp_cov than the aforementioned prior art process without compromising any other MTJ properties such as MR ratio. In the exemplary embodiment, a first Mg layer having a thickness t1 of 8 to 12 Angstroms, and preferably 10 Angstroms, is deposited on the SAF AP1 layer 16 in a PVD chamber of an Anelva sputtering system in step 100. Thereafter, a first ROX step 101 is performed with an oxygen flow rate of 1 to 2 standard liters per minute (slm) and an applied RF power of 600 to 1000 Watts for 60 to 80 seconds, and preferably 800 Watts for 70 seconds, in an oxidation chamber of the Anelva sputtering system. It is believed that a critical feature is the first Mg layer is not completely oxidized so as to minimize the risk of oxygen diffusion into the adjoining AP1 CoFe layer during a subsequent anneal step. Note that the ROX process of record (POR) practiced by the inventors for a 10 Angstrom Mg layer is a 140 second treatment at 800 Watts with a 1 to 2 slm oxygen flow rate. Those skilled in the art will appreciate that the 70 second ROX treatment of the present invention produces a MgO layer that is in an "underoxidized state" with respect to the MgO layer generated with a ROX treatment at the same power that is twice as long. In other words, the POR is understood to completely oxidize all Mg atoms in the first Mg layer while the ROX process with reduced time is believed to leave a certain number of unoxidized Mg atoms in the partially oxidized first Mg layer with the highest concentration of unreacted Mg atoms located in a region adjoining the AP1 layer. According to a preferred embodiment, the region of partially oxidized first Mg layer at the interface with the AP1 layer does not become fully oxidized even after a subsequent annealing process.

An "underoxidized state" for the oxidized first Mg layer may be determined by performing a ROX process on a series of wafers with an identical stack of layers having an uppermost Mg layer which is 10 Angstroms thick, for example, and measuring the resistancexarea (RA) value for the partially formed MTJ stack by a known method after various oxidation times at a certain RF power and oxygen flow rate. Thus, a first wafer may be treated to a 1 slm oxygen flow rate at 800 Watts for 60 seconds while a second wafer is treated for 65 seconds under the same conditions, and so forth up to an nth wafer treated for 140 seconds at 1 slm oxygen flow rate and 800 Watts. A fully oxidized state is reached at a time=T and the RA value becomes essentially constant for all ROX times greater than T. For ROX times less than T, the RA value will gradually increase from the minimum reaction time to a reaction time=T seconds.

Returning to the flow diagram in FIG. 3a, a second Mg layer with a thickness t2 of 3 to 5 Angstroms is deposited on the oxidized first Mg layer in a PVD chamber in step 102. Preferably, all deposition and oxidation steps described herein are performed in the same Anelva mainframe to optimize throughput. Thickness t2 is preferably less than t1 and may be adjusted within the thickness range mentioned above to tune the RA value for the entire tunnel barrier layer 18. Generally, the RA value is not measured on product wafers immediately after ROX steps but primarily during ROX process optimization on non-product substrates. As explained later, the MgO tunnel barrier is not fully formed until a free layer and capping layer are deposited and the entire stack of MTJ layers is annealed. After annealing, a measurement may be obtained to determine a RA value for the complete MTJ stack of layers.

During step 103, a second ROX process is carried out to fully oxidize the second Mg layer and may comprise the same RF power and oxygen flow rate as in the first ROX step. However, reaction time is reduced to between 20 and 50 seconds since t2 is considerably thinner than t1. It is important not to significantly exceed the ROX reaction time where the second Mg layer (not shown) is fully oxidized because prolonged oxygen radical bombardment may damage the top portion of the tunnel barrier and reduce MR ratio and device stability. In this context, over oxidation is defined as a state wherein essentially all the Mg atoms in the second Mg layer are oxidized and extended oxygen radical bombardment has caused unwanted surface roughness. Furthermore, oxygen is typically absorbed in the oxidized second Mg layer. It is critical to avoid long ROX times in order that the oxygen concentration does not become so great that the absorbed oxygen migrates into the free layer during a subsequent annealing step and thereby degrades the MR ratio and other important MTJ properties.

According to one embodiment, a third or uppermost Mg layer having a thickness from 2 to 4 Angstroms is deposited on the oxidized second Mg layer in step 104. Then the composite free layer and capping layer are sequentially deposited on the third Mg layer. During a subsequent anneal step (not shown), oxygen in the oxidized second Mg layer migrates into the uppermost Mg layer to cause oxidation therein. Following the anneal step, the tunnel barrier layer is considered a single layer since all of the Mg layers are oxidized and an interface between the individual oxidized Mg layers is not obvious with a cross-sectional view using transmission electron microscopy (TEM).

Figure 3B:
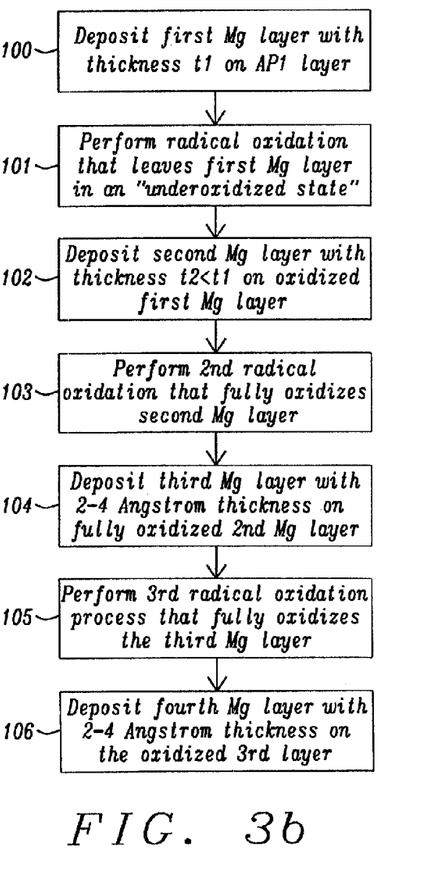
FIG. 3b is a flow chart diagram showing a multi-step MgO tunnel barrier formation sequence according to another embodiment of the present disclosure.

In an alternative embodiment depicted in FIG. 3b, the third Mg layer is fully oxidized in step 105 by a ROX treatment similar to the process employed in step 103. Then a fourth Mg layer having a thickness from 2 to 4 Angstroms is deposited on the oxidized third Mg layer in step 106. Thereafter, a free layer and capping layer are formed on the uppermost Mg layer before an anneal step is used to diffuse oxygen into the fourth Mg layer from the underlying MgO stack and thereby generate a single MgO layer. The anneal step is described in a later section. Again, the thickness of individual Mg layers in steps 100, 102, 104, and 106 may be adjusted to arrive at the desired RA value for the tunnel barrier layer after annealing.

According to one embodiment of the present invention, a composite free layer 19 is formed on the tunnel barrier 18. The composite free layer has a FL1/FL2/FL3 configuration (not shown herein) as described and illustrated in related patent application Ser. No. 13/068,222 wherein a first crystalline magnetic layer (FL1) contacts a top surface of the tunnel barrier layer, and a second crystalline magnetic layer (FL2) and an amorphous layer (FL3) that may be either magnetic or non-magnetic are sequentially formed on the FL1 layer. Preferably, the FL1 layer is made of CoFe with an Fe content of 60 to 90 atomic % and has a bcc (001) crystal structure to match that of the MgO tunnel barrier layer 18 and thereby promote coherent tunneling which leads to a high MR ratio. Alternatively, iron rich CoFeB may be used as the FL1 layer. In yet another embodiment, the FL1 layer may be comprised of a composite including a combination of CoFe and CoFeB layers such as CoFeB/CoFe. The FL1 layer is responsible for providing a high MR ratio as a result of its interface with the tunnel barrier layer. When the FL1 layer is CoFe, thickness is at least 4 Angstroms and preferably about 6 Angstroms in order to provide good film uniformity and high MR ratio. It is important that FL1 thickness is not allowed to increase significantly above 6 Angstroms so that magnetostriction and switching properties of the MTJ are not adversely affected.

The FL2 layer is relied upon to provide improved switching performance without degrading a high MR ratio established by the tunnel barrier/FL1 configuration. Accordingly, the FL2 layer is preferably Fe in a bcc (001) crystal phase and having a thickness from 12 to 21 Angstroms. Note that the soft magnetic property of Fe enables better switching behavior than a hard magnetic property of CoFe.

The amorphous FL3 layer is employed to improve one or more of switching performance and reduce shorting without adversely affecting the MR ratio or other desirable properties associated with the lower crystalline FL1 and FL2 layers. Preferably, the upper amorphous FL3 layer has a thickness from 20 to 40 Angstroms and is comprised of NiFeX where X is one of Hf, Zr, Nb, Ta, or Mg with a content of about 5 to 30 atomic %. The FL3 Layer is preferably amorphous rather than crystalline so that the FL3 layer does not affect the crystal structure in the lower FL1, FL2 layers where a bcc (001) crystalline phase is preferred for high MR ratio. In related patent application Ser. No. 12/930,877, we disclosed how a Fe/NiFeX or Fe/NiFe/NiFeX composite free layer offers additional benefits by reducing the number of shorted bits and lowering the bit switching current.

The FL1 layer in the aforementioned FL1/FL2/FL3 free layer configuration should be at least 4 to 6 Angstroms thick in order to achieve a high MR ratio. Thinner layers may have pinholes that degrade MTJ performance. FL2 layer thickness may be adjusted between 12 and 21 Angstroms to satisfy the Mst (magnetic saturation×thickness) requirement for composite free layer 19. Moreover, FL2 thickness is preferably greater than FL1 thickness for optimum MTJ performance. Note that the amorphous FL3 layer generally contributes substantially less toward the Mst requirement for the composite free layer than the FL1 and FL2 layers because the magnetic moment of the NiFeX layer is reduced by the presence of the X element.

The minimum X content necessary to achieve an amorphous NiFeX film is about 5 atomic % for X. On the other hand, the X content should not be more than about 30 atomic %, especially for Ta or Nb, to prevent X from diffusing into the crystalline FL1 and FL2 magnetic layers and degrading the free layer properties. The magnetostriction ($\lambda$) of the free layer 19 may be adjusted by changing the thicknesses of the FL1, FL2, and FL3 layers and by modifying the X content in NiFeX. Although both Fe and NiFeX, for example, typically contribute a positive value to $\lambda$, for free layer 19, CoFe provides the largest (+)$\lambda$ contribution in a CoFe/Fe/NiFeHf composite. As the %X in NiFeX increases, $\lambda$ generally increases.

Those skilled in the art will appreciate that a NiFeX alloy may have either a (+) or (−)λ value, depending on the Ni content and X content in the alloy. Typically, a λ approaching $1\times10^{-6}$ is desirable for the free layer 19.

In an alternative embodiment, the composite free layer 19 may have a Fe/NiFeX configuration as described and illustrated in related patent application Ser. No. 12/930,877. The crystalline magnetic layer that contacts the tunnel barrier layer 18 is made of Fe, or an alloy thereof such as $FeB_y$ where y is from 0 to about 5 atomic %, or Ni. The crystalline magnetic layer has a (001) crystal orientation to match that of the MgO tunnel barrier layer and thereby promote coherent tunneling which leads to a high MR ratio. A small amount of B of up to about 5 atomic % may be added to Fe in order to lower Hc and improve thermal stability. In this embodiment, the Fe layer has a thickness between 12 and 21 Angstroms. The upper NiFeX has the same properties and thickness range as mentioned in the previous embodiment.

The capping layer 20 formed on the composite free layer 19 may have a Ta or Ta/Ru composition although other capping layer materials may be used. The capping layer serves as an electrical contact with an overlying top electrode (bit line) and typically is employed as an etch stop and/or chemical mechanical polish (CMP) stop layer during subsequent processing steps. A Ta capping layer 20 serves as an oxygen getter layer to prevent oxygen from diffusing into the crystalline magnetic layer and lowering the TMR ratio, and is preferably an α-phase Ta layer with low resistance.

Figure 2:
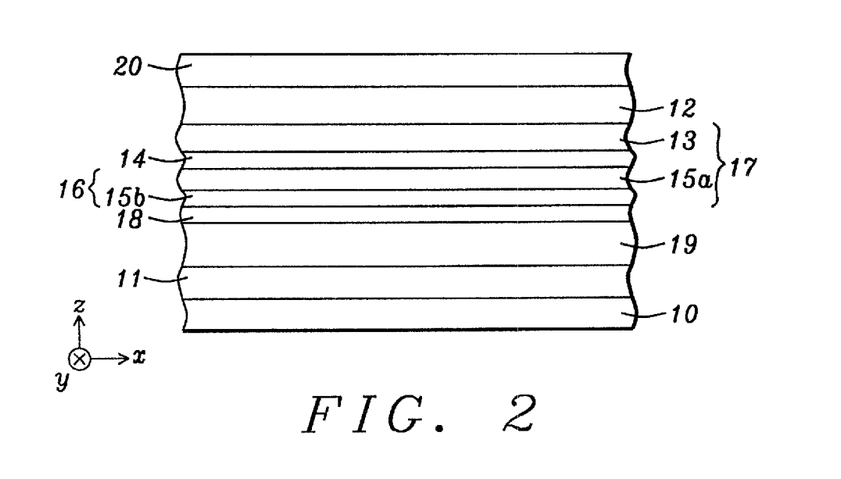
FIG. 2 is a cross-sectional view of the MTJ structure having a top spin valve configuration formed according to a second embodiment of the present disclosure.

According to a second embodiment of the present invention as depicted in FIG. 2, the free layer 19 as described in the bottom spin valve embodiments may be formed in a top spin valve configuration. For example, the MTJ stack may be fabricated by sequentially forming a seed layer 11, composite free layer 19, tunnel barrier 18, SAF pinned layer 17, AFM layer 12, and capping layer 20 on substrate 10. In this case, free layer 19 may have a FL2/FL1 (NiFeX/Fe) or a FL3/FL2/FL1 (NiFeX/Fe/CoFe) configuration wherein the NiFeX layer is the bottom layer in the free layer stack and contacts a top surface of seed layer 11. Thus, the uppermost FL1 layer interfaces with the tunnel barrier 18 to produce a high MR ratio. The properties and thicknesses of the aforementioned layers are retained from the previous embodiments. Note that the SAF pinned layer 17 has an AP1/coupling/AP2 configuration wherein the AP1 layer 16 contacts a top surface of the tunnel barrier layer and the AP2 layer 13 contacts a bottom surface of the AFM layer 12.

For improved flexibility in modifying the NiFeX composition in the FL3 layer, the NiFeX layer in the composite free layer 19 is preferably deposited by co-sputtering NiFe and X targets. In one embodiment, the NiFe target has a Ni content of 80 atomic % and a Fe content of 20 atomic % although Ni/Fe ratios other than 4:1 may be employed.

It is believed that one important mechanism responsible for achieving a high MR ratio involves gettering oxygen from the FL1, FL2 crystalline magnetic layers in composite free layer 19 by the FL3 (NiFeX) layer. Thus, FL1 and FL2 magnetic layers are less oxygen contaminated and have higher conductivity, thereby improving the MR ratio dR/R also known as DRR. Although the actual mechanism is not understood at this time, it is believed that the oxygen gettering power of a NiFeX layer may be at least partially responsible for an improved switching property and reduced bit shorts.

The present disclosure also encompasses an annealing step after all of the MTJ layers have been deposited. For example, in the first and second embodiments, the MTJ stack of layers is preferably annealed by applying a magnetic field of about 10000 Oe in magnitude along the desired in-plane magnetization direction for about 1 hour at 360° C. or approximately 2 hours at a temperature of 330° C. In general, the 10000 Oe magnetic field is preferably applied for a period of 1 to 2 hours between 330° C. and 360° C. Temperatures higher than 360° C. may damage the device while temperatures below 330° C. are expected to lower the MR ratio of the MTJ.

After all of the MTJ layers have been deposited and annealing is completed, a MTJ element with sidewalls and a top surface having a circular, elliptical, or polygonal shape from a top view (not shown) may be fabricated by conventional photoresist patterning and etching techniques as we have previously described in U.S. Pat. No. 7,595,520. Thereafter, the remainder of the MRAM structure is formed by well known methods including deposition of an interlevel dielectric layer (ILD) adjacent to the MTJ element and thereby electrically separating the MTJ from other MTJ elements in the MRAM array (not shown). Typically, a CMP step is performed to provide an ILD that is coplanar with the top surface of the MTJ. Then a metal layer (not shown) including bit lines, for example, is formed on the ILD and top surfaces of the MTJ elements in the MRAM array.

We conducted an experiment to determine the performance of a MTJ stack formed on a substrate according to a first embodiment of the present invention and shown in Table 1 as reference numbers 3 and 4. Reference 1 represents a process of record (POR) practiced by the inventors. All MTJ samples have a bottom spin valve configuration represented by the following stack of layers: NiCr45/MnPt150/AP2/Ru/AP1/MgO/Fe20/NiFeHf30/Ta458 where the number following the composition of each layer is the thickness in Angstroms of that layer. As indicated, the stack is made of a seed layer (NiCr), AFM layer (MnPt), SAF pinned layer (AP2/Ru/AP1), MgO tunnel barrier, composite free layer (Fe/NiFeHf), and a Ta capping layer. In each case, the MgO tunnel barrier was formed by depositing two or three layers and performing a ROX process after each deposition except for the final Mg deposition. The MgO layer in prior art reference 1 was prepared by depositing a first Mg layer 10 Angstroms thick, performing a ROX process for 140 seconds at 800 Watts with a 1 slm $O_2$ flow rate, and then depositing a second Mg layer 3 Angstroms thick. The MgO layer in references 2-4 was prepared according to a method of the present invention wherein a first MgO layer 10.5 Angstroms thick is deposited followed by a first ROX process for 70 seconds at 800 W and 1 slm $O_2$. Then a second Mg layer 3 Angstroms thick was deposited and oxidized for 20 seconds at the aforementioned ROX conditions. Finally, a third Mg layer 2 Angstroms thick was deposited on the oxidized second Mg layer. All samples were annealed with an in-plane magnetic field of 10000 Oe. In the experiments, $Co_{75}Fe_{25}$ was employed for the AP2 layer and $Co_{60}Fe_{20}B_{20}/Co_{75}Fe_{25}$ was used for the AP1 layer.

TABLE 1

Magnetic properties of MTJs represented by NiCr45/PtMn150/
AP2(Co$_{75}$Fe$_{25}$)/Ru7.5/AP1(Co$_{60}$Fe$_{20}$B$_{20}$/Co$_{75}$Fe$_{25}$)/MgO(ROX)/Fe/NiFeHf30/Ta458

| Ref # | AP2 CoFe | AP1 CoFeB | AP1 CoFe | MgO | Fe (ang) | Bs (nWb) | Hin (Oe) | Hc (Oe) | Rp_cov | DRR % | DRR/ Rp_cov |
|---|---|---|---|---|---|---|---|---|---|---|---|
| 1* | 24 | 23 | — | 2 Mg | 18.1 | 0.896 | 2.9 | 40 | 4.9% | 72.5 | 14.7 |
| 2* | 24 | 23 | — | 3 Mg | 20.9 | 0.986 | −4.6 | 4.2 | 4.4% | 69.0 | 15.8 |
| 3* | 25 | 15 | 6 | 3 Mg | 20.1 | 0.913 | −5.1 | 4.2 | 3.5% | 60.4 | 17.5 |
| 4** | 25 | 15 | 6 | 3 Mg | 20.1 | 0.870 | −7.2 | 4.3 | 3.5% | 65.5 | 18.4 |

*Anneal at 330° C. for 2 hours;
**Anneal at 360° C. for 1 hour

In all examples shown above, a Ni$_R$Fe$_S$Hf$_T$ layer where R=78, S=10, and T=12 was deposited by co-sputtering a Ni$_{88}$Fe$_{12}$ target and a Hf target in an Anelva 7100 sputter deposition system. The preferred deposition method comprises applying a forward power of 100 Watts (W) to 300 W to the Hf target and a forward power of 200 W to 600 W to the NiFe target to deposit a NiFeHf layer at a pressure less than about 0.3 mTorr and at an ambient temperature. As indicated in Table 1, DRR/Rp_cov is improved from 14.7 (POR reference 1) to 17.5 in a MTJ stack made according to an embodiment of the present invention (reference 3). A comparison of reference 4 to reference 3 demonstrates that higher annealing temperature (360° C. vs 330° C.) affords an even greater improvement to 18.4 for DRR/Rp_cov, and DRR % increases as well.

Figure 4A:
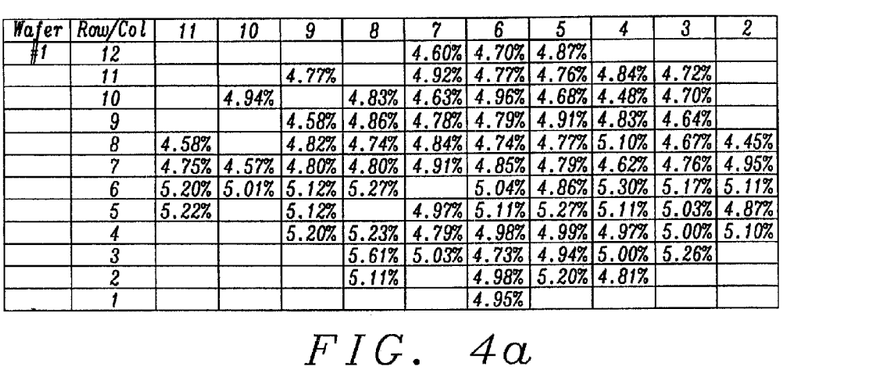
FIG. 4a is a table that shows a Rp_cov map of a wafer fabricated with a MTJ stack that includes a CoFeB AP1 layer and a MgO tunnel barrier made with two Mg deposition steps and one radical oxidation (ROX) step as previously practiced by the inventors.
Figure 4B:
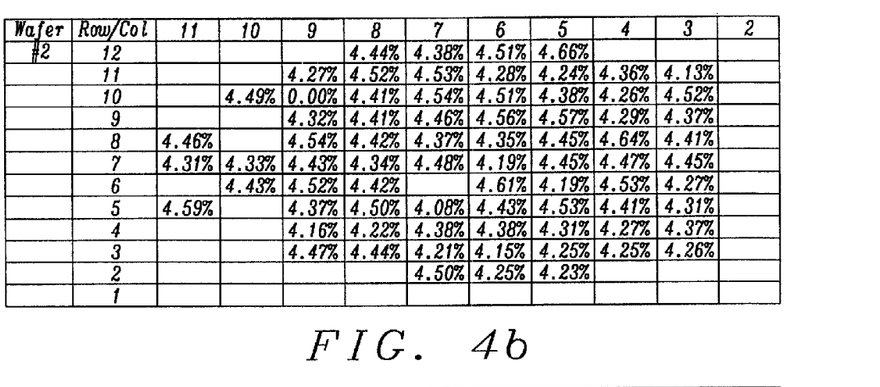
FIG. 4b is a table that shows a Rp_cov map of a wafer fabricated with a MTJ stack that includes a CoFeB AP1 layer and a MgO tunnel barrier made with three Mg deposition steps and two ROX steps according to one embodiment of the present disclosure.
Figure 4C:
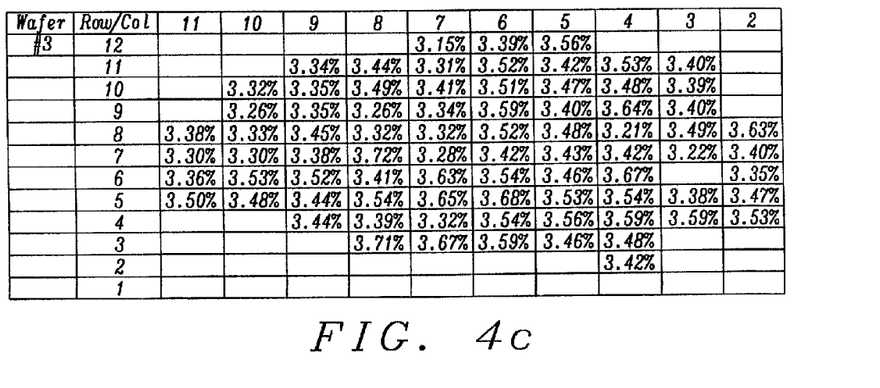
FIG. 4c is a table that shows a Rp_cov map of a wafer fabricated with a MTJ stack that includes a CoFeB/CoFe AP1 layer and a MgO tunnel barrier made with three Mg deposition steps and two ROX steps according to a preferred embodiment of the present disclosure.

The MTJ stacks described with regard to Table 1 are C-shaped patterns and were fabricated by a conventional process to form an array of MTJ elements aligned in rows and columns which were incorporated into one of our 90 nm technology 16 Mb MRAM chips. FIGS. 4a-4c show Rp_cov across an entire 8 inch diameter wafer wherein each chip has a designated row/column in the table in the figures. Note that FIG. 4a shows the Rp_cov wafer map for the prior art POR process listed as reference 1 in Table 1, FIG. 4b shows a Rp_cov map for reference 2 in Table 1, and FIG. 4c shows the Rp_cov map for reference 3 in Table 1. As shown in Table 1 and in the full wafer maps (FIGS. 4a-4c), the lowest Rp_cov and best reading margin is achieved with reference 3 (or 4) where a composite AP1 layer with a CoFeB/CoFe configuration is formed adjacent to a MgO tunnel barrier fabricated by a process involving at least 3 separate Mg layer depositions followed by a ROX step after each of the first two Mg depositions.

In summary, we have demonstrated how the combination of a CoFeB/CoFe AP1 layer, MgO tunnel barrier constructed with a multi-step ROX process, and a composite free layer with an uppermost NiFeX layer in a bottom spin valve structure may be used to improve reading margin for MRAM performance to a level not achieved by any prior art MTJ and without deteriorating other properties such as MR ratio (DRR %), MTJ shorting, or MTJ switching. Furthermore, the higher writing margin realized in the related patent applications having a Fe/NiFeX or CoFe/Fe/NiFeX composite free layer is retained according to the embodiments of the present invention. DRR % for the embodiments in Table 1 (Ref. 3 and 4) is expected to increase by replacing the Fe/NiFeHf free layer with a CoFe/Fe/NiFeHf composite free layer.

While the present disclosure has been particularly shown and described with reference to, the preferred embodiment thereof, it will be understood by those skilled in the art that various changes in form and details may be made without departing from the spirit and scope of this disclosure.

We claim:

1. A MTJ element in a magnetic device, comprising:
(a) a pinned layer formed on a substrate and having an AP2/coupling layer/AP1 configuration wherein the AP2 layer is a first ferromagnetic layer, the coupling layer enables anti-ferromagnetic coupling between the AP2 and AP1 layers, and AP1 is a composite ferromagnetic layer with a CoFeB layer contacting the coupling layer and a CoFe layer that interfaces with a tunnel barrier layer, the CoFe layer has a thickness less than a thickness of the CoFeB layer;
(b) the tunnel barrier layer made of a metal oxide that forms a first interface with the AP1 layer; the tunnel barrier layer has a bottom portion with a first thickness and a certain number of unoxidized metal atoms, and a fully oxidized second portion formed on the first portion with a second thickness less than the first thickness;
(c) a composite free layer having a FL1/FL2/FL3 or Fe/NiFeX stack of layers wherein FL1 is a first crystalline ferromagnetic layer that forms a second interface with the tunnel barrier layer along a surface that is opposite to the first interface, FL2 is a second crystalline ferromagnetic layer that is Fe, and FL3 is an amorphous NiFeX layer where X is one of Hf, Zr, Nb, Ta, or Mg, the amorphous NiFeX layer is the uppermost layer in the FL1/Fe/NiFeX or Fe/NiFeX stack.

2. The MTJ element of claim 1 wherein the CoFe layer in the AP1 pinned layer has a Fe content between 0 and about 30 atomic % and a thickness from about 4 to 8 Angstroms.

3. The MTJ element of claim 1 wherein the metal oxide is MgO, AlOx, or TiOx.

4. The MTJ element of claim 1 wherein the FL1/FL2/FL3 stack of layers has a CoFe/Fe/NiFeHf configuration.

5. The MTJ element of claim 1 wherein X is Hf in the amorphous NiFeX layer, and the NiFeHf layer has a thickness between about 20 and 40 Angstroms.

6. The MTJ element of claim 1 wherein the Fe (FL2) free layer has a thickness from about 12 to 21 Angstroms, and the FL2 layer thickness is greater than a thickness of the FL1 layer.

7. The MTJ element of claim 1 wherein the FL1 layer is a CoFe layer with an iron content between about 60 and 90 atomic %, or is an iron rich CoFeB layer, or is a combination of CoFe and CoFeB layers.

8. The MTJ element of claim 1 wherein the X element has a content from about 5 to 30 atomic % in the NiFeX layer.

9. A MTJ element in a magnetic device, comprising:
(a) a composite free layer having a FL3/FL2/FL1 or NiFeX/Fe stack of layers formed on a substrate wherein FL1 is a first crystalline ferromagnetic layer that forms a first interface with a bottom surface of a tunnel barrier layer, FL2 is a second crystalline ferromagnetic layer that is Fe, and FL3 is an amorphous NiFeX layer where X is one of Hf, Zr, Nb, Ta, or Mg, the amorphous NiFeX layer is the bottom layer in the NiFeX/Fe/FL1 or NiFeX/Fe stack;

(b) the tunnel barrier layer made of a metal oxide and having a fully oxidized portion with a second thickness adjoining the FL1 layer and an upper portion with a first thickness greater than the second thickness and containing a certain number of unoxidized metal atoms, the upper portion contacts an AP1 layer in an overlying pinned layer; and (c) the pinned layer having a AP1/coupling/AP2 configuration formed on a top surface of the tunnel barrier layer wherein the AP2 layer is a first ferromagnetic layer, the coupling layer enables anti-ferromagnetic coupling between the AP2 and AP1 layers, and AP1 is a composite ferromagnetic layer with a CoFe/CoFeB stack wherein the CoFeB layer contacts the coupling layer and the CoFe layer interfaces with the tunnel barrier layer, the CoFe layer has a thickness less than a thickness of the CoFeB layer.

10. The MTJ element of claim 9 wherein the CoFe layer in the AP1 pinned layer has a Fe content between 0 and about 30 atomic % and a thickness from about 4 to 8 Angstroms.

11. The MTJ element of claim 9 wherein the tunnel barrier layer is made of MgO, AlOx, or TiOx.

12. The MTJ element of claim 9 wherein the FL3/FL2/FL1 stack of layers has a NiFeHf/Fe/CoFe configuration.

13. The MTJ element of claim 9 wherein X is Hf in the amorphous NiFeX layer, and the NiFeHf layer has a thickness between about 20 and 40 Angstroms.

14. The MTJ element of claim 9 wherein the Fe (FL2) free layer has a thickness from about 12 to 21 Angstroms, and the FL2 thickness is greater than a thickness of the FL1 layer.

15. The MTJ element of claim 9 wherein the FL1 layer is a CoFe layer with an iron content between about 60 and 90 atomic %, or is an iron rich CoFeB layer, or is a combination of CoFe and CoFeB layers.

16. The MTJ element of claim 9 wherein the X element has a content from about 5 to 30 atomic % in the NiFeX layer.

* * * * *